(12) United States Patent
Yu et al.

(10) Patent No.: US 11,598,815 B2
(45) Date of Patent: Mar. 7, 2023

(54) BATTERY TEST SYSTEM AND BATTERY TEST METHOD

(71) Applicant: NINGDE AMPEREX TECHNOLOGY LIMITED, Ningde (CN)

(72) Inventors: Xiaoqing Yu, Ningde (CN); Shi Tan, Ningde (CN); Zhu Feng, Ningde (CN); Zhiwen Xiao, Ningde (CN)

(73) Assignee: NINGDE AMPEREX TECHNOLOGY LIMITED, Ningde (CN)

( * ) Notice: Subject to any disclaimer, the term of this patent is extended or adjusted under 35 U.S.C. 154(b) by 0 days.

(21) Appl. No.: 16/236,879

(22) Filed: Dec. 31, 2018

(65) Prior Publication Data
US 2020/0072908 A1    Mar. 5, 2020

(30) Foreign Application Priority Data
Aug. 31, 2018  (CN) .......................... 201811013625.6

(51) Int. Cl.
*G01R 31/385*    (2019.01)
*G01R 31/3835*    (2019.01)
*G01R 31/378*    (2019.01)

(52) U.S. Cl.
CPC ....... *G01R 31/3865* (2019.01); *G01R 31/378* (2019.01); *G01R 31/3835* (2019.01)

(58) Field of Classification Search
CPC .............. G01R 31/378; G01R 31/3835; G01R 31/3865; H01M 10/052; H01M 10/48;
(Continued)

(56) References Cited

U.S. PATENT DOCUMENTS

| 5,491,420 A | * | 2/1996 | Parker .................... G01D 7/005 |
| | | | 324/435 |
| 5,729,149 A | * | 3/1998 | Bradshaw .......... G01R 31/2887 |
| | | | 324/750.25 |

(Continued)

FOREIGN PATENT DOCUMENTS

| CN | 1889293 A | * | 1/2007 |
| CN | 1963554 A | | 5/2007 |

(Continued)

OTHER PUBLICATIONS

"UL Standard for Safety of Lithium Batteries, UL 1642," 5th edition, dated Mar. 13, 2012, 31 pages.

(Continued)

*Primary Examiner* — Vinh P Nguyen
(74) *Attorney, Agent, or Firm* — Juan Carlos A. Marquez; Marquez IP Law Office, PLLC

(57) ABSTRACT

This application relates to a battery test system and a battery test method. The battery test system according to an embodiment comprises: an extrusion apparatus configured to be disposed on a first surface of a battery; and a pressure apparatus, disposed above the extrusion apparatus, where the pressure apparatus is configured to apply a predetermined force to the battery in predetermined duration through the extrusion apparatus. The battery test system and the battery test method provided in this application are able to more reasonably evaluate the safety of the soft package battery and identify the risk caused by the defect of the soft package battery.

14 Claims, 5 Drawing Sheets

(58) Field of Classification Search
CPC .. H01M 10/486; H01M 50/103; H01M 50/55; H01M 50/557; Y02E 60/10
See application file for complete search history.

(56) References Cited

U.S. PATENT DOCUMENTS

| | | | | |
|---|---|---|---|---|
| 6,602,633 | B1* | 8/2003 | Ohbayashi | H01M 10/4257 429/61 |
| 7,336,081 | B2* | 2/2008 | Kasamatsu | H01M 10/4285 324/426 |
| 8,035,394 | B2* | 10/2011 | Takeno | H01M 10/486 324/426 |
| 9,574,979 | B2* | 2/2017 | Jansky | H01M 10/4285 |
| 2015/0212162 | A1* | 7/2015 | Nakayama | G01R 31/52 324/426 |
| 2017/0082693 | A1* | 3/2017 | Leidich | G01R 31/50 |
| 2019/0384254 | A1* | 12/2019 | Torok | G01R 31/3644 |

FOREIGN PATENT DOCUMENTS

| | | | |
|---|---|---|---|
| CN | 2929737 | Y | 8/2007 |
| CN | 101452057 | A | 6/2009 |
| CN | 102384854 | A | 3/2012 |
| CN | 203479842 | U | 3/2014 |
| CN | 105334106 | A | 2/2016 |
| CN | 106124998 | A * | 11/2016 |
| CN | 106207065 | A | 12/2016 |
| CN | 106711512 | A * | 5/2017 |
| CN | 107317047 | A * | 11/2017 |
| CN | 206834238 | U * | 1/2018 |
| CN | 108267695 | A | 7/2018 |
| EP | 2071659 | A2 | 6/2009 |
| KR | 20150054372 | A | 5/2015 |

OTHER PUBLICATIONS

UL Standard for Safety for Lithium Batteries UL1642, http://jmg1.zyzhan.com/5/20090519/633783482645312500, pdf, pp. 15-16; Jun. 24, 1999.
European Search Repod, dated Jan. 14, 2020, in corresponding European application EP 19180735.3, 10 pages in English.
Chinese First Office Action dated May 21, 2020 in counterpart Chinese application 201811013625.6, 8 pages in Chinese.
Chinese Second Office Action and Supplemental Search Report dated Mar. 17, 2021 in counterpart Chinese application 201811013625.6, 8 pages in Chinese.

* cited by examiner ic # BATTERY TEST SYSTEM AND BATTERY TEST METHOD

CROSS REFERENCE TO RELATED APPLICATIONS

The present application claims the benefit of priority from the China Patent Application No. 201811013625.6, filed on 31 Aug. 2018, the disclosure of which is hereby incorporated by reference in its entirety.

BACKGROUND

1. Field of the Invention

This application relates to the field of battery tests, and in particular, to a battery test system and a battery test method.

2. Description of the Related Art

Lithium-ion batteries have been widely used in various fields such as electronic products and electric vehicles. In the industry, a UL 1642 (Lithium Batteries) impact test is currently used for testing safety performance of a lithium-ion battery after the lithium-ion battery is rapidly impacted. However, for a soft pack battery without housing protection, during the UL 1642 impact test, the soft pack battery is usually severely damaged and even broken directly after being impacted. However, such a case in which the soft pack battery is severely damaged rarely occurs during actual use of the soft pack battery. Therefore, for the soft pack battery, the UL 1642 impact test is too strict to objectively reflect safety performance during actual use of the soft pack battery.

Therefore, the industry needs a test system and method suitable for the soft pack battery.

SUMMARY

One aspect of this application is to provide a battery test system and a battery test method that are applicable to the test of a soft pack battery.

One embodiment of this application provides a battery test system, including: an extrusion apparatus configured to be disposed on a first surface of a battery; and a pressure apparatus, disposed above the extrusion apparatus, wherein the pressure apparatus is configured to apply a predetermined force to the battery in predetermined duration through the extrusion apparatus.

In another embodiment of this application, the pressure apparatus is configured to descend at a predetermined speed to contact the extrusion apparatus.

In still another embodiment of this application, a contact surface of the extrusion apparatus with the first surface of the battery is a substantially flat surface.

In another embodiment of this application, the extrusion apparatus is a batten, and a longitudinal section shape of the batten is square, triangular, circular, or semi-circular.

In still another embodiment of this application, a side edge of the contact surface of the extrusion apparatus has a chamfer.

In another embodiment of this application, the chamfer has a radius of a circular arc from about 0.5 mm to about 5 mm.

In still another embodiment of this application, the extrusion apparatus is fastened to the first surface of the battery with glue or a fastening tape.

In another embodiment of this application, the battery test system further comprises a data collection apparatus configured for collecting battery parameters of the battery, the battery parameters including temperature and voltage of the battery.

In still another embodiment of this application, the battery test system further comprises a carrying apparatus, wherein a second surface of the battery is configured to be disposed on the carrying apparatus, and the second surface is opposite to the first surface.

Another embodiment of this application provides a battery test method, including: disposing an extrusion apparatus on a first surface of a battery; and applying a predetermined force to the extrusion apparatus through a pressure apparatus to press the battery and keep so for a predetermined time.

In still another embodiment of this application, the step of applying a predetermined force to the extrusion apparatus through a pressure apparatus comprises: descending the pressure apparatus at a predetermined speed to contact the extrusion apparatus.

In another embodiment of this application, the predetermined speed ranges from about 0.5 mm/s to about 100 mm/s.

In still another embodiment of this application, the test method further comprises: collecting, by a data collection apparatus, battery parameters of the battery, the battery parameters including temperature and voltage of the battery.

In another embodiment of this application, the test method further comprises: disposing a second surface of the battery on a carrying apparatus, and the second surface is opposite to the first surface.

In still another embodiment of this application, the step of collecting battery parameters of the battery comprises: collecting the battery parameters of the battery after the battery pressed by the extrusion device is stored at room temperature for a predetermined time.

In another embodiment of this application, the test method further comprises: testing with a normal battery, and determining, by changing the predetermined force and/or the predetermined time, a critical value where battery parameters of the normal battery start to change.

The battery test system and the battery test method provided in this application are able to reasonably evaluate the safety of the soft pack battery and identify the risk caused by the defect of the soft pack battery.

BRIEF DESCRIPTION OF THE DRAWINGS

To describe the embodiments of this application, the following briefly describes the accompanying drawings required for describing the embodiments of this application or the prior art. Apparently, the accompanying drawings in the following descriptions are merely some embodiments of this application, and persons skilled in the art may still derive drawings of other embodiments from examples of structures shown in these accompanying drawings without creative efforts.

DETAILED DESCRIPTION

Figure 1:
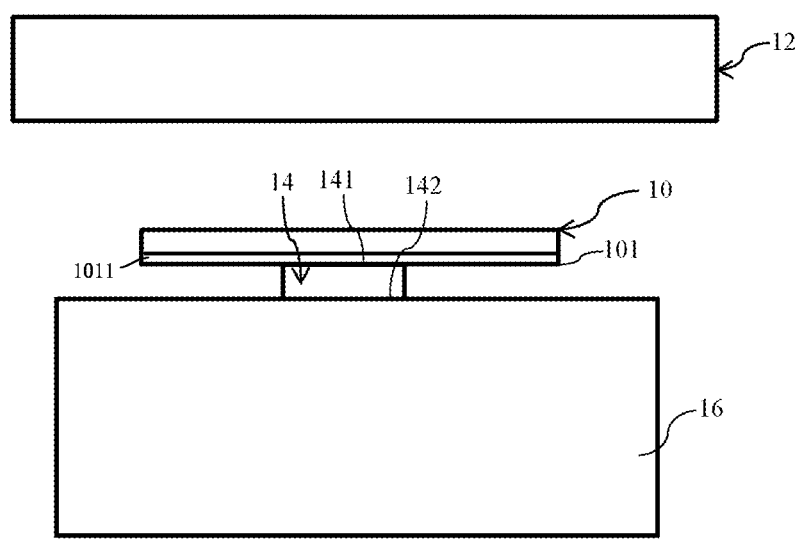
FIG. 1 is a schematic longitudinal cross-sectional view of a battery test system according to an embodiment of this application.

Embodiments of this application are described below in detail. Throughout the entire specification of this application, same or similar components or components having same or similar functions are represented by using similar reference numerals. The embodiments related to the accompanying drawings that are described herein are illustrative and schematic, and are used to provide basic understanding for this application. The embodiments of this application should not be construed as limitations to this application.

In this specification, unless otherwise particularly indicated or limited, relativistic wordings such as "central", "longitudinal", "lateral", "front", "back", "right", "left", "inner", "outer", "relatively low", "relatively high", "horizontal", "vertical", "higher than", "lower than", "above", "below", "top", "bottom", and derived wordings thereof (such as "horizontally", "downward", and "upward") should be construed as referenced directions described in discussion or shown in the accompanying drawings. These relativistic wordings are merely for ease of description, and require constructing or operating this application in a particular direction.

As used in this application, terms "about", "roughly", "substantially", "essentially", and "approximately" are used for describing and explaining a small variation. When being used in combination with an event or a case, the terms can refer to an example in which the event or case exactly occurs or an example in which the event or case similarly occurs. For example, when being used in combination with a value, the terms may refer to a variation range being less than or equal to ±10% of the value, for example, less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, if a difference between two values is less than or equal to ±10% of an average value of the values (for example, less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%), it could be considered that the two values are "substantially" the same or "approximate".

Furthermore, for ease of description, the terms "first", "second", "third", and the like may be used for distinguishing between different components in a diagram or a series of diagrams. The terms "first", "second", "third", and the like are not intended to describe corresponding components.

In this specification, unless otherwise particularly indicated or limited, wordings such as "dispose", "connect", "couple", "fix", and similar wordings thereof are widely used, and a person skilled in the art may understand, based on a specific case, the foregoing wordings as, for example, fixedly connected, detachably connected, or integrally connected, or may be mechanically connected or electronically connected, or may be directly connected or indirectly connected by using an intermediate structure; or may be internal communication between two components.

In consideration of a case in which during use of a battery in a terminal, the battery may be suddenly impacted or smashed by a heavy object. Therefore, an impact test is added to UL 1642. The UL 1642 impact test is disposing a round bar with a diameter of 15.8 mm±0.1 mm at the center of a battery, and then making an iron block with a weight of 9.1 kg±0.46 kg freely fall from a height of 610 mm±25 mm to impact the battery. A criterion of a qualified battery is no fire and no explosion. However, for the soft pack battery, the method for directly impacting the soft pack battery by using the heavy object and the round bar is not suitable. A reason lies in that the soft pack battery does not have housing protection, so that the soft pack battery is usually severely damaged and even is broken directly after being impacted during the UL 1642 impact test. However, during actual use of the soft pack battery, the situation in which a housing of the battery is broken or the battery is broken due to an impact rarely occurs. Therefore, in the UL 1642 impact test, the situation that would occur during actual use of the soft pack battery is not ideally tested. Consequently, safety of the battery cannot be appropriately estimated, and a safety risk caused by a defect in the battery cannot be identified.

Actually, for lithium-ion batteries and various other types of batteries, when the battery is mechanically damaged to an extent, a short circuit may occur within the battery. As a result, the battery generates a large amount of heat within a short time. If the heat keeps gathering, various types of safety accidents such as smoking, leakage, and fire are caused. Therefore, the industry needs a safety test system and method that are able to test the anti-risk capability of the battery after the battery is damaged. Further, in consideration of various types of applications and cases of the battery, the battery in a terminal product is usually protected by an apparatus such as the housing. During actual use, a most possible case is that a press force is indirectly and continuously applied to the battery when a product is pressed or impacted. Because a defect may occur at a local pressed part of the battery when a safety test is performed on the battery, if the damaged location can be selected as a location in which a short circuit most easily occurs in the battery, the safety test has sufficient pertinence and applicability, thereby exerting a maximum value for testing a risk of the battery.

In view of the above, this application provides a battery test system. The battery test system comprises an extrusion apparatus configured to be disposed on a surface of the battery, and a pressure apparatus disposed above the extrusion apparatus. The pressure apparatus applies a predetermined force to the battery in predetermined duration through the extrusion apparatus, so that a local part of the battery is continuously pressed to a predetermined extent. The battery test system can simulate a case in which the battery is easily damaged when the battery is used in a terminal system, thereby effectively estimating safety performance after the battery is pressed. If a defect exists in the battery, a short circuit may occur, and even cause a case where leakage, smoking, or fire occurs. Therefore, according to the battery test system provided in this application, the quality and safety level of the battery can be directly determined, thereby identifying an inner defect and a risk of the battery. Preferred embodiments of the battery test system that are provided in this application are described below in detail.

Figure 2:
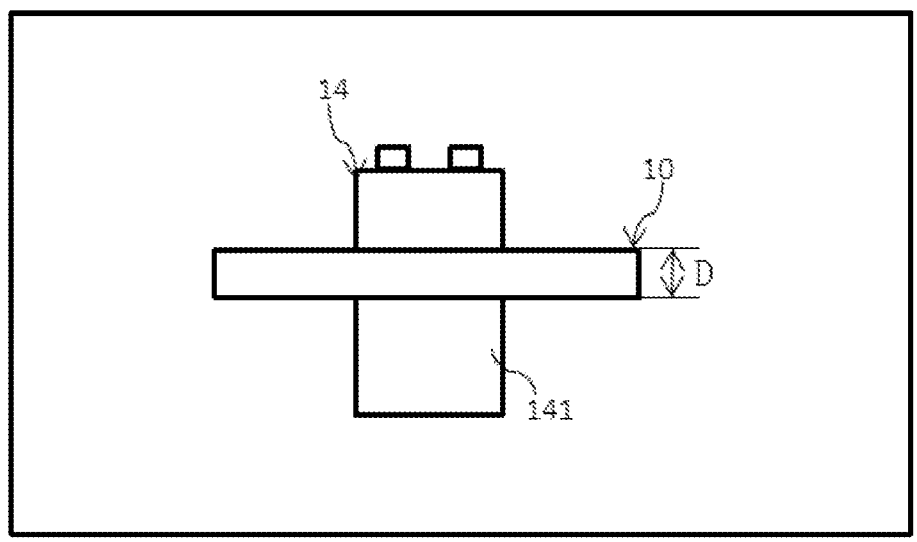
FIG. 2 is a schematic top view of a part of the battery test system according to the embodiment shown in FIG. 1.

FIG. 1 is a schematic longitudinal cross-sectional view of a battery test system 100 according to an embodiment of this application. FIG. 2 is a schematic top view of a part of the battery test system 100 according to the embodiment shown in FIG. 1. As shown in FIG. 1 and FIG. 2, the battery test system 100 according to the embodiment of this application comprises an extrusion apparatus 10, a pressure apparatus 12, a battery 14, and a carrying apparatus 16.

The extrusion apparatus 10 is fastened to a first surface 141 of the battery 14 through, for example, but is not limited to, a glue (not shown). In other embodiments of this application, the extrusion apparatus 10 may alternatively be fastened to the first surface 141 of the battery 14 with a fastening tape or any other suitable manner. In the embodiments shown in FIG. 1 and FIG. 2, the extrusion apparatus 10 may be a batten whose longitudinal section shape is square and width D is approximately 10 mm, and the batten may be made of steel. A contact surface 101 of the extrusion apparatus 10 with the first surface 141 of the battery 14 is a substantially flat surface. To prevent a side edge of the extrusion apparatus 10 from cutting the battery 14, the side edge of the contact surface 101 of the extrusion apparatus 10 is provided with a chamfer 1011, i.e., the contact surface of the extrusion apparatus 10 with the battery 14 is an arc surface. The chamfer 1011 has a radius of a circular arc from about 0.5 mm to about 5 mm.

The width, shape, and material of the batten are not limited to those shown in the foregoing embodiments. In other embodiments of this application, the batten is made of any material having suitable hardness, for example, stainless steel. In other embodiments of this application, the width D of the batten whose longitudinal section shape is square may be about 5 mm to about 150 mm. In another embodiment of this application, the extrusion apparatus 10 may be a batten whose longitudinal section shape is triangular and side length is about 5 mm to about 150 mm. In still another embodiment of this application, the extrusion apparatus 10 may be a batten whose longitudinal section shape is circular and diameter is about 5 mm to about 150 mm. In another embodiment of this application, the extrusion apparatus 10 may be a batten whose longitudinal section shape is semi-circular and diameter is about 5 mm to about 150 mm.

In the embodiments shown in FIG. 1 and FIG. 2, the pressure apparatus 12 is disposed above the extrusion apparatus 10 and applies a predetermined force to the battery 14 in predetermined duration through the extrusion apparatus 10. The predetermined force may be set according to a specific battery size. In one embodiment of this application, the predetermined force is about 5 kN to about 200 kN. In another embodiment of this application, the predetermined force is about 5 kN to about 100 kN. In one embodiment of this application, the predetermined duration may be about 1 minute. In another embodiment of this application, the predetermined duration may be any suitable time, and may be determined according to specific needs or battery size.

In one embodiment of this application, the pressure apparatus 12 is configured to descend at a predetermined speed to contact the extrusion apparatus 10. The predetermined speed is about 0.5 mm/s to about 500 mm/s. In another embodiment of this application, the predetermined speed is about 0.5 mm/s to about 100 mm/s. In still another embodiment of this application, the pressure apparatus 12 may be configured to descend at a predetermined constant speed to contact the extrusion apparatus 10. In another embodiment of this application, the pressure apparatus 12 may be configured to descend at a predetermined non-constant speed to contact the extrusion apparatus 10.

A local part of the battery 14 is continuously pressed by continuously pressing the extrusion apparatus 10 through the pressure apparatus 12, thereby properly inspecting the battery 14. If a defect exists in the battery 14, a short circuit may occur, and even cause a case where leakage, smoking, or fire may occur. Therefore, the quality and safety level of the battery can be directly determined. After the pressure apparatus 12 continuously presses the extrusion apparatus 10, the battery in which no short circuit occurs only shows a certain amount of deformation. In comparison with the UL 1642 impact test, the amount of deformation occurred at a local part of the battery according to the present disclosure is much closer to what a battery protected in a terminal device actually experiences under pressing. That is, the battery is not broken, but experiences press deformation.

The battery 14 has a first surface 141 and a second surface 142 opposite to the first surface 141. The second surface 142 is fastened to the carrying apparatus 16 through, for example, but is not limited to, a glue. In other embodiments of this application, the battery 14 may alternatively be fastened to the carrying apparatus 16 with a fastening tape or any other suitable manner. The battery 14 is a soft pack battery of any type in the art, for example, but not limited to, a soft pack lithium-ion battery.

The carrying apparatus 16 is used for carrying the battery 14, and the surface of the carrying apparatus 16 for carrying the second surface 142 of the battery 14 is flat. In one embodiment of this application, the carrying apparatus 16 may be a test bench.

In another embodiment of this application, the battery test system 100 further comprises a data collection apparatus (not shown). The data collection apparatus is used for collecting battery parameters of the battery 14. The battery parameters include various parameters that can indicate safety performance of the battery 14, such as, but are not limited to, temperature and voltage. When the pressure apparatus 12 is descended at a certain speed to contact the extrusion apparatus 10, a local part of the battery 14 is impacted initially. During a process in which the force of the extrusion apparatus 10 is continuously applied to the battery 14, the temperature and the voltage of the battery 14 can more accurately reflect whether a short circuit occurs in the battery 14. If a short circuit occurs, the temperature will rise at a certain speed, and the voltage drop will reach a certain value after a certain time. Therefore, a damaged state in the battery 14 can be more clearly determined by detecting the parameters such as the temperature and the voltage.

Figure 3:
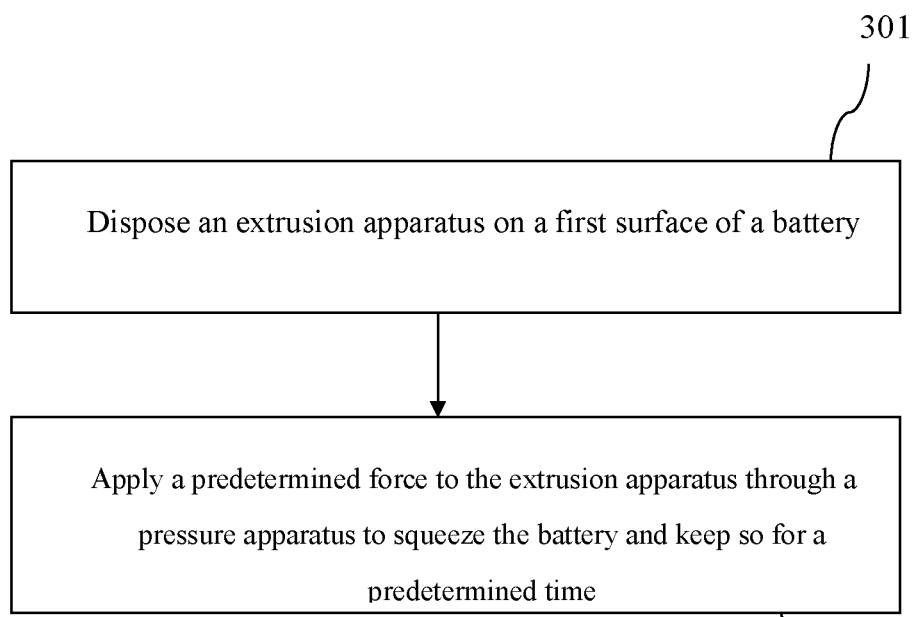
FIG. 3 is a schematic flowchart of a battery test method according to an embodiment of this application.

FIG. 3 is a schematic flowchart of a battery test method 300 according to one embodiment of this application, which uses the battery test system 100 provided by the embodiment shown in FIGS. 1 and 2 of this application.

According to the embodiment shown in FIG. 3, in step 301, the surface 101 of the extrusion apparatus 10 is disposed on the first surface 141 of the battery 14 by using glue, a fastening tape, or any other suitable manner (not shown).

In step 302, a predetermined force is applied to the extrusion apparatus 10 through the pressure apparatus 12 to press the battery 14 for a predetermined time, wherein the step of applying a predetermined force to the extrusion apparatus 10 through the pressure apparatus 12 comprises: descending the pressure apparatus 12 at a predetermined speed to contact the extrusion apparatus 10. The predetermined speed ranges from about 0.5 mm/s to about 500 mm/s. In another embodiment of this application, the predetermined speed is about 0.5 mm/s to about 100 mm/s. In an embodiment of this application, the pressure apparatus 12 is descended at a predetermined constant speed to contact the extrusion apparatus 10. In another embodiment of this application, the pressure apparatus 12 is descended at a predetermined non-constant speed to contact the extrusion apparatus 10.

The pressure apparatus 12 applies the predetermined force to the battery 14 through the extrusion apparatus 10 in the predetermined duration. The predetermined force may be set according to a specific battery size. In an embodiment of this application, the predetermined force is about 5 kN to about 200 kN. In another embodiment of this application, the predetermined force is about 5 kN to about 100 kN. In an embodiment of this application, the predetermined duration may be about 1 minute. In another embodiment of this application, the predetermined duration may be any suitable time. A local part of the battery 14 is continuously pressed by continuously pressing the extrusion apparatus 10 through the pressure apparatus 12, thereby properly inspecting the battery 14. If a defect exists in the battery 14, a short circuit may occur, and even cause a case where leakage, smoking, or fire may occur. Therefore, according to the battery test method 300 provided in this application, a defect in the battery can be directly identified. In addition, because various parameters such as the force that is applied by the pressure apparatus 12 to the battery 14 and the time in which the force is applied can be adjusted, the battery test method 300 according to the embodiment of this application has good flexibility and pertinence, so that different test conditions can be configured for different types of batteries. Therefore, the battery test method 300 according to the embodiment of this application is suitable for detecting defects of various types of batteries.

In one embodiment of this application, the battery test method 300 provided in the embodiment shown in FIG. 3 further comprises a step of providing the carrying apparatus 16 for carrying the battery 14 and fastening the battery 14 to the carrying apparatus 16 by using glue, a fastening tape, or any other suitable manner. The carrying apparatus 16 may be any test bench having a flat test surface.

In another embodiment of this application, the battery test method 300 further comprises: providing a data collection apparatus, to enable the data collection apparatus to perform a step of collecting battery parameters of the battery 14. The battery parameters include various parameters that can indicate safety performance of the battery 14, for example, but are not limited to, temperature and voltage. When the pressure apparatus 12 is descended at a speed to contact the extrusion apparatus 10, a local part of the battery 14 is impacted initially. During a process in which the force of the extrusion apparatus 10 is continuously applied to the battery 14, the temperature and the voltage of the battery 14 can more directly reflect whether a short circuit occurs in the battery 14. If a short circuit occurs, the temperature will rise at a certain speed, and the voltage drop will reach a certain value. Therefore, a damaged state in the battery 14 can be more clearly detected by detecting the parameters such as the temperature and the voltage.

In another embodiment of this application, the battery test method 300 further comprises a step of collecting the battery parameters of the battery 14 after the battery 14 pressed by the extrusion apparatus 10 is placed at room temperature for about 24 hours. If a decreased value of an open-circuit voltage (OCV) of the battery is less than about 30 mV after about 24 hours, the battery 14 is qualified. If a short circuit occurs at a defect location of the battery 14 after the battery 14 is pressed, an obvious voltage drop will occur after about 24 hours.

The battery test method 300 of this application is applicable to batteries of various designs. In an embodiment of this application, the battery test method 300 further comprises: testing with a normal battery and determining by changing the predetermined force and/or the predetermined time, a critical value where battery parameters of the normal battery start to change, and used to distinguish a normal battery from a defective battery. For example, when the press time is fixed, a critical force/pressure of the normal battery can be found by changing the press force, so that magnitude value of the predetermined force is determined as a test criterion for distinguishing between a normal battery and a defective battery (for example, batteries with an overly high welding height). Therefore, for batteries of a same type, the defective batteries can be detected by using test conditions of the normal batteries, so as to determine the quality and safety level of the battery.

Test Instance

Tested Object

Three groups of soft pack lithium-ion batteries of a same type (type I) were provided. A first group of batteries are 10 batteries known as batteries of normal types. A second group of batteries are also 10 batteries known as batteries of normal types. A third group of batteries are 10 batteries where defects in the batteries are unknown.

Test Method

According to the battery test method in this application, a stainless batten whose shape is square and width is 10 mm was provided. The pressure apparatus 12 descended at a speed of 15 mm/s to contact the stainless batten, the pressure apparatus was set to continuously apply, for 80s by means of the stainless batten, a force of 12.6 kN to a part of a battery of a normal type that is located 3 mm away from the top end of the battery, and temperature and voltage changes of the tested battery within 80s were measured. In addition, a voltage change of the tested battery was measured again after the tested battery had been stored at room temperature for 24 hours. If the temperature and the voltage of the tested battery did not obviously change within 80s, i.e., the temperature change ranged from approximately 1 degree to approximately 10 degrees, and the voltage change ranged from 0 volts to 0.03 volt, and no obvious voltage drop was observed after the tested battery had been stored at room temperature for 24 hours, it may be considered that the battery is qualified.

When other parameters such as a test time remain unchanged, the condition where a battery known as a battery of a normal type became defective was obtained by continuously changing the values of the applied force/pressure. In this way, test parameters for distinguishing between a defective battery and a normal battery could be found.

For example, Table 1 shows test results of the three groups of batteries. The first group of batteries were all qualified in a condition in which the force was 12.6 kN and the pressure was 53 MPa, i.e., temperatures and voltages of all the first group of batteries did not obviously change in the 80s press time, and no obvious voltage drop was observed after the batteries had been stored at the room temperature for 24 hours. For the second group of batteries in a condition in which the force was 12.8 kN and the pressure was 54 MPa, one battery is not qualified, the temperature and the voltage of the unqualified battery did not obviously change in the 80s press time, and there was an obvious voltage drop after the unqualified battery had been stored at room temperature for 24 hours. Therefore, the test conditions for the first group of batteries were determined as test criteria for distinguishing between a normal battery and a defective battery.

Then, according to the battery test method in this application, a same stainless batten whose shape is square and width is about 10 mm was provided. The same pressure apparatus descended at a speed of 15 mm/s, which is the same as the descending speed of the pressure apparatus for the first and the second group of batteries, to contact the stainless batten, the pressure apparatus was set to continuously apply, for 80s by means of the stainless batten, a force of 12.6 kN to a part of each battery in the third group of batteries that is located 3 mm away from the top end of the battery). Only four qualified batteries are detected in the third group of batteries by using the method. It is discovered, through further analysis and detection on six unqualified batteries, that all of the six unqualified batteries have a defect of a too high welding height at the portion of 3 mm away from the top end of the battery.

TABLE 1 the test results of three groups of batteries

| Group | Force/kN | Pressure/MPa | Quantity of tested batteries | Quantity of qualified batteries |
| --- | --- | --- | --- | --- |
| First group | 12.6 | 53 | 10 | 10 |
| Second group | 12.8 | 54 | 10 | 9 |
| Third group | 12.6 | 53 | 10 | 4 |

The applicant found that, through the experiments, for type-I batteries, defective batteries can be strictly inspected by using the stainless batten whose shape is square and width is 10 mm, descending the pressure apparatus at the speed of 15 mm/s to contact the stainless batten, and continuously applying the force of 12.6 kN to the battery within 80s by means of the batten.

Figure 4A:
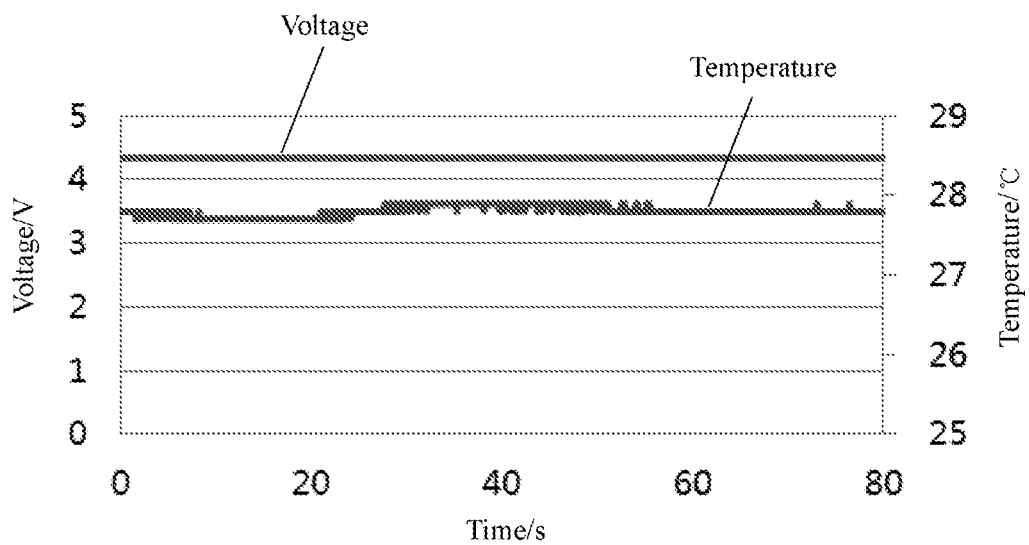
FIG. 4a is a curve diagram of voltage-temperature versus time for a normal battery obtained using a battery test method according to an embodiment of this application.
Figure 4B:
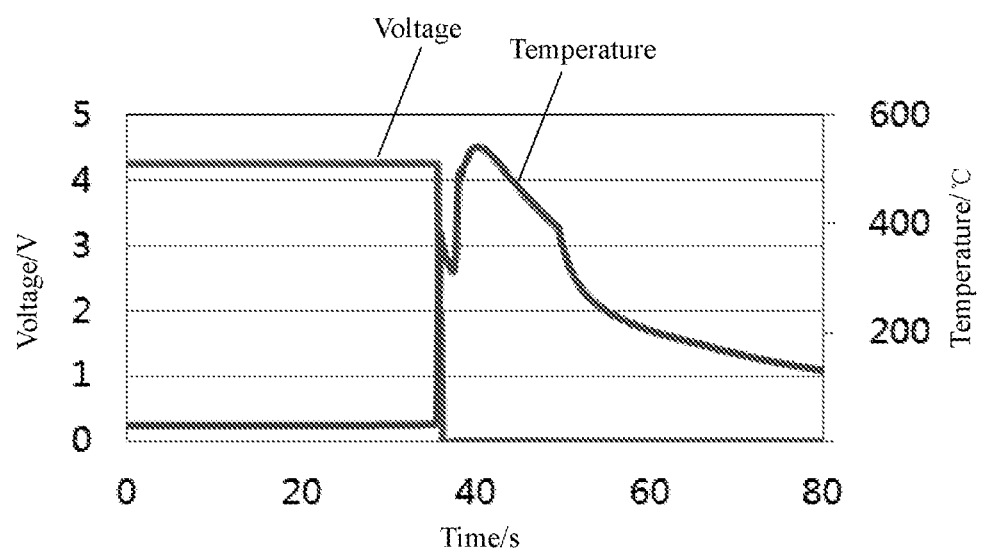
FIG. 4b is a curve diagram showing voltage-temperature versus time of a defective battery obtained using the battery test method of an embodiment of this application.

Now refer to FIG. 4a and FIG. 4b. FIG. 4a is a curve diagram of voltage-temperature versus time for a normal battery obtained using the above battery test method according to an embodiment of this application. FIG. 4b is a curve diagram showing voltage-temperature versus time of a defective battery obtained using the battery test method 300 of an embodiment of this application.

Types of a normal battery and a defective battery shown in FIG. 4a and FIG. 4b are the same as the type of the foregoing three groups of batteries. According to the battery test method 300 in this application, a stainless batten whose shape is square and width is 10 mm was used; the pressure apparatus descended at a speed of 15 mm/s to contact the stainless batten, and the pressure apparatus was set to continuously apply, for 80s by means of the stainless batten, a force of 12.6 kN to a part of the battery that is located 3 mm away from the top end of the battery used in FIG. 4a. Test parameters for the battery used in FIG. 4b were the same as those used for the battery in FIG. 4a. It can be observed that voltage and temperature changes of the normal battery shown in FIG. 4a were very small. Moreover, no obvious voltage drop is observed after the battery in FIG. 4a had been stored at room temperature for 24 hours. However, the voltage of the defective battery shown in FIG. 4b directly decreased to approximately 0 V when the pressure apparatus applied the force to the battery for about 40s, and the temperature linearly rose twice.

Specifically, if a defect exists in the battery, during a process in which the battery is pressed, a short circuit occurs at a defect location of the battery, which renders that the voltage decreases and the temperature rises. Moreover, different types of short circuits in the battery cause different voltage and temperature changes. For example, for some defective batteries, after a short circuit occurs in the battery, the voltage directly decreases to approximately 0 V, and the temperature directly linearly rises. However, for some defective batteries, after a short circuit occurs in the defective battery, the voltage decreases firstly, then rebounds, and then decreases again, and the temperature linearly rises twice.

Figure 4C:
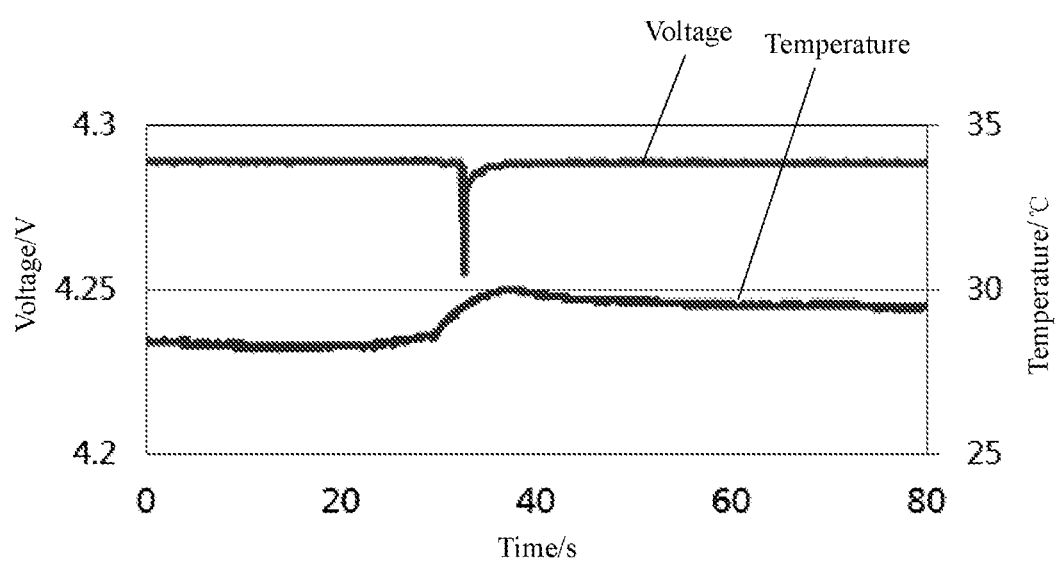
FIG. 4c is a curve diagram of voltage-temperature versus time for another defective battery obtained using the battery testing method of an embodiment of this application.

FIG. 4c is a curve diagram of voltage-temperature versus time for another defective battery obtained using the battery testing method 300 of an embodiment of this application. According to the battery test method 300 in this application, a stainless batten whose shape is square and width is 10 mm was used; the pressure apparatus descended at a speed of 15 mm/s to contact the stainless batten, and the pressure apparatus was set to continuously apply, for 80s by means of the stainless batten, a force of 12.6 kN to a part of the battery that is located 3 mm away from the top end of the battery used in FIG. 4c. After the battery test method 300 according to the embodiment of this application was used for the defective battery, a short circuit occurs in the defective battery due to continuous press, an obvious voltage drop was caused at a moment when the battery had been pressed for 20s to 40s, and the temperature also obviously rose.

In addition, even if for some batteries 14, no obvious voltage drop and temperature rise were found after these batteries 14 were pressed, voltage drops of the batteries 14 may occur after the batteries 14 had been stored at room temperature for 24 hours. Therefore, parameters of the battery 14 during the test and parameters of the battery 14 after the battery 14 has been tested for 24 hours are monitored, so that it is doubly ensured that any safety problem with the battery 14 can be identified.

For the soft pack battery without housing protection, pressing the battery to be completely broken is not the best test method. A case in which a local part of the battery is damaged is more likely to easily occur than a case in which the battery is completely broken. Compared with the UL 1642 impact test, in the battery test method provided in this application, the battery can be tested in a case which is closest to an actual case in which the battery is damaged. Therefore, an inner defect and a risk of the battery are identified when the battery is mechanically damaged. In addition, for batteries of a same type, according to the battery test method provided in this application, defective batteries can be further detected by using test conditions for a normal battery to determine the quality and safety level of the batteries.

Technical content and technical features of this application are disclosed above. However, persons skilled in the art may still make replacements and modifications based on the teachings and the disclosure of this application without departing from the spirit of this application. Therefore, the protection scope of this application should not be limited to the content disclosed in the embodiments, and should include various replacement and modifications without departing from this application, and is covered by the claims of this patent.

What is claimed is:

1. A battery test system for testing a soft pack battery, comprising:
an extrusion apparatus configured to be disposed on a first surface of a battery, wherein the battery is a soft pack battery; and
a pressure apparatus disposed above the extrusion apparatus, wherein the pressure apparatus is configured to apply a predetermined force to the battery in a predetermined duration through the extrusion apparatus, wherein a first surface of the extrusion apparatus configured to contact with the first surface of the battery is a substantially flat surface, and a side edge of the first surface of the extrusion apparatus has a chamfer, wherein the predetermined force is 5 KN to 100 KN.

2. The battery test system according to claim 1, wherein the pressure apparatus is configured to descend at a predetermined speed to contact the extrusion apparatus.

3. The battery test system according to claim 1, wherein the extrusion apparatus is a batten, and a longitudinal section shape of the batten is square, or triangular.

4. The battery test system according to claim 1, wherein the chamfer has a radius of a circular arc from 0.5 mm to 5 mm.

5. The battery test system according to claim 1, wherein the extrusion apparatus is fastened to the first surface of the battery with a glue or a fastening tape.

6. The battery test system according to claim 1, further comprising a data collection apparatus for collecting battery parameters of the battery, wherein the battery parameters comprise temperature and voltage of the battery.

7. The battery test system according to claim 1, further comprising a carrying apparatus, wherein a second surface of the battery is configured to be disposed on the carrying apparatus, and the second surface of the battery is opposite to the first surface of the battery.

8. A method for testing a soft pack battery, comprising:
disposing an extrusion apparatus on a first surface of a battery, wherein the battery is a soft pack battery; and
applying a predetermined force to the extrusion apparatus through a pressure apparatus for a predetermined time to squeeze the battery; wherein a first surface of the extrusion apparatus configured to contact with the first surface of the battery is a substantially flat surface, and a side edge of the first surface of the extrusion apparatus has a chamfer, wherein the predetermined force is 5 KN to 100 KN.

9. The method according to claim 8, wherein the step of applying a predetermined force to the extrusion apparatus through a pressure apparatus comprises: descending the pressure apparatus at a predetermined speed to contact the extrusion apparatus.

10. The method according to claim 9, wherein the predetermined speed ranges from 0.5 mm/s to 100 mm/s.

11. The method according to claim 8, further comprising: collecting battery parameters of the battery by a data collection apparatus, wherein the battery parameters comprise temperature and voltage of the battery.

12. The method according to claim 11, wherein the step of collecting battery parameters of the battery comprises: collecting the battery parameters of the battery after the battery squeezed by the extrusion device is stored at room temperature for the predetermined time.

13. The method according to claim 11, wherein applying the predetermined force to the extrusion apparatus through the pressure apparatus for the predetermined time to squeeze the battery comprises: applying the predetermined force to the extrusion apparatus through the pressure apparatus for the predetermined time to squeeze a normal battery, and determining, by changing the predetermined force or the predetermined time, a critical value where battery parameters of the normal battery start to change.

14. The method according to claim 8, further comprising: disposing a second surface of the battery on a carrying apparatus, wherein the second surface of the battery is opposite to the first surface of the battery.

* * * * *